(12) United States Patent
Saketi (10) Patent No.: US 10,707,105 B1
(45) Date of Patent: Jul. 7, 2020

(54) SELECTIVE SHAPE MEMORY ALLOY PICK-UP HEAD

(71) Applicant: Facebook Technologies, LLC, Menlo Park, CA (US)

(72) Inventor: Pooya Saketi, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/287,096

(22) Filed: Feb. 27, 2019

Related U.S. Application Data (60) Provisional application No. 62/650,216, filed on Mar. 29, 2018.

(51) Int. Cl.
| | |
|---|---|
| *H01L 21/67* | (2006.01) |
| *H01L 25/075* | (2006.01) |
| *H01L 33/62* | (2010.01) |
| *B65G 47/90* | (2006.01) |
| *F03G 7/06* | (2006.01) |
| *H01L 33/06* | (2010.01) |
| *H01L 33/10* | (2010.01) |
| *H01L 33/24* | (2010.01) |
| *H01L 33/40* | (2010.01) |

(52) U.S. Cl.
CPC ........ *H01L 21/67144* (2013.01); *B65G 47/90* (2013.01); *F03G 7/065* (2013.01); *H01L 25/0753* (2013.01); *H01L 33/62* (2013.01); *H01L 33/06* (2013.01); *H01L 33/10* (2013.01); *H01L 33/24* (2013.01); *H01L 33/405* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 6,408,289 B1 * | 6/2002 | Daum ................. | A61F 2/586 706/44 |
| 10,212,867 B2 * | 2/2019 | Yue ................... | B65G 47/907 |
| 10,410,893 B2 * | 9/2019 | Hsu .................. | H01L 33/0095 |
| 2017/0142874 A1 * | 5/2017 | Pourchet ............ | H01L 21/6836 |

* cited by examiner

*Primary Examiner* — Bradley Smith
(74) *Attorney, Agent, or Firm* — Fenwick & West LLP (57) ABSTRACT

A pick-up head array with shape memory alloy (SMA) pick-up heads is used for selective pick-up and placement of semiconductor devices. In response to the application of heat, the SMA body portions of one or more of the pick-up heads of the pick-up head array transition from a shortened state to an extended state. In the extended state, the one or more pick-up heads are able to attach to one or more LEDs on a carrier substrate. The LEDs are removed from the carrier substrate and placed onto a target substrate by the pick-up head array. Heat may be applied to the one or more pick-up heads to bond the LEDs to the target substrate. The LEDs are then detached from the pick-up head array, and heat may be removed from the one or more pick-up heads to return them to their rest state.

18 Claims, 8 Drawing Sheets

```
┌─────────────────────────────────────────────────────────┐
│     Positioning the pick-up head array over              │
│     semiconductor devices on a carrier substrate         │
│                        410                               │
└─────────────────────────────────────────────────────────┘
                            │
                            ▼
┌─────────────────────────────────────────────────────────┐
│  Selectively applying heat to SMA body portions of the one or more pick-│
│  up heads, causing them to transition from a shortened state to an      │
│  extended state and attach to one or more of the semiconductor devices  │
│                        420                               │
└─────────────────────────────────────────────────────────┘
                            │
                            ▼
┌─────────────────────────────────────────────────────────┐
│         Placing the one or more semiconductor devices    │
│                    on a target substrate                 │
│                        430                               │
└─────────────────────────────────────────────────────────┘
                            │
                            ▼
┌─────────────────────────────────────────────────────────┐
│    Selectively applying heat to the one or more pick-up heads           │
│    to bond the one or more semiconductor devices to the target substrate│
│                        440                               │
└─────────────────────────────────────────────────────────┘
                            │
                            ▼
┌─────────────────────────────────────────────────────────┐
│         Detaching the one or more semiconductor devices  │
│                  from the pick-up head array             │
│                        450                               │
└─────────────────────────────────────────────────────────┘
                            │
                            ▼
┌─────────────────────────────────────────────────────────┐
│   Removing heat from the SMA body portions of the one or more           │
│   pick-up heads to transition them back to the rest state               │
│                        460                               │
└─────────────────────────────────────────────────────────┘
```

SELECTIVE SHAPE MEMORY ALLOY PICK-UP HEAD

CROSS REFERENCE TO RELATED APPLICATIONS

This application claims the benefit of U.S. Provisional Application Ser. No. 62/650,216 filed 29 Mar. 2018, which is incorporated in its entirety herein by this reference.

TECHNICAL FIELD

The present disclosure relates to device fabrication, and more specifically to selectively picking up and placing chips used in devices.

BACKGROUND

The present disclosure relates to using a vacuum pick-up and transfer process to pick and place of display elements from an initial substrate to a receiving substrate.

To populate a display with very small light emitting diodes (LEDs), such as micro-light emitting diodes (μLEDs) or vertical-cavity surface-emitting lasers (VCSELs), there may be a need to transfer the LEDs from the native substrate on which they have been manufactured to a target substrate that forms part of a display, or "display substrate." Such small semiconductor devices may be assembled with a defined separation distance between them or closely packed together on the target substrate. Because of the small size of these devices (e.g., between 1 μm$^2$ and 20 μm$^2$), conventional pick and place techniques are unsuitable.

SUMMARY

A pick-up head array with shape memory alloy (SMA) pick-up heads is used for selective pick-up and placement of semiconductor devices, such as LEDs (e.g., μLEDs and VCSELs) in electronic displays. Each pick-up head of the pick-up head array includes an SMA body portion that expands when heat is applied and, in some embodiments, retracts when heat is removed. In response to the application of heat, the SMA body portions of one or more of the pick-up heads of the pick-up head array transition from a shortened state to an extended state. In the extended state, the one or more pick-up heads are able to attach to one or more LEDs on a carrier substrate. The LEDs are removed from the carrier substrate and placed onto a target substrate by the pick-up head array. Heat may be applied to the one or more pick-up heads to bond the LEDs to the target substrate. The LEDs are then detached from the pick-up head array, and heat may be removed from the one or more pick-up heads to return them to their shortened state.

BRIEF DESCRIPTION OF THE DRAWINGS

Exemplary implementations of the present disclosure are described herein with reference to the accompanying drawings, in which.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Generally disclosed herein are methods, and systems for selectively picking up and placing semiconductor devices using a pick-up head array including pick-up heads with shape memory alloy (SMA) body portions having adjustable length according to application of heat. The pick-up head array may include multiple pick-up heads that can be individually selected to transition from a shortened state to an extended state. The selected pick-up heads in the extended state contact and pick up semiconductor devices on a carrier substrate, such as LEDs, for placement on a display substrate while other pick-up heads in the shortened state do not pick up semiconductor devices. As such, the pick-up head array facilitates assembly of electronic displays including pixels formed by the LEDs placed on the display substrate. Furthermore, application of heat to the semiconductor devices during placement may be used to bond the semiconductor devices to control circuits in the display substrate. Additionally disclosed is an electronic display manufactured by a process for selectively picking up and placing semiconductor devices using a pick-up head array.

In one embodiment, a method comprises positioning an array of pick-up heads over light emitting diodes (LEDs) on a carrier substrate, each of the pick-up heads of the array including: a shape memory alloy (SMA) body portion that transitions from a shortened state to an extended state responsive to application of heat; and a pick-up surface at an end of the SMA body portion; and selectively applying heat to one or more pick-up heads of the array, the application of heat causing the SMA body portions of the one or more pick-up heads to transition to the extended state to attach one or more LEDs of the LEDs on the carrier substrate with pick-up surfaces of the one or more pick-up heads.

In another embodiment, a system comprises an array of pick-up heads, each of the pick-up heads of the array including: a shape memory alloy (SMA) body portion that transitions from a shortened state to an extended state responsive to application of heat; and a pick-up surface at an end of the SMA body portion.

In yet another embodiment, an electronic display is manufactured by a process comprising: positioning an array of pick-up heads over light emitting diodes (LEDs) on a carrier substrate, each of the pick-up heads of the array including: a shape memory alloy (SMA) body portion that transitions from a shortened state to an extended state responsive to application of heat; and a pick-up surface at an end of the SMA body portion; selectively applying heat to one or more pick-up heads of the array, the application of heat causing the SMA body portions of the one or more pick-up heads to transition to the extended state to attach one or more LEDs of the LEDs on the carrier substrate with pick-up surfaces of the one or more pick-up heads; and with the one or more LEDs attached with the one or more pick-up heads, placing the one or more LEDS on a display substrate of the electronic display.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Micro-LED Overview

Figure 1:
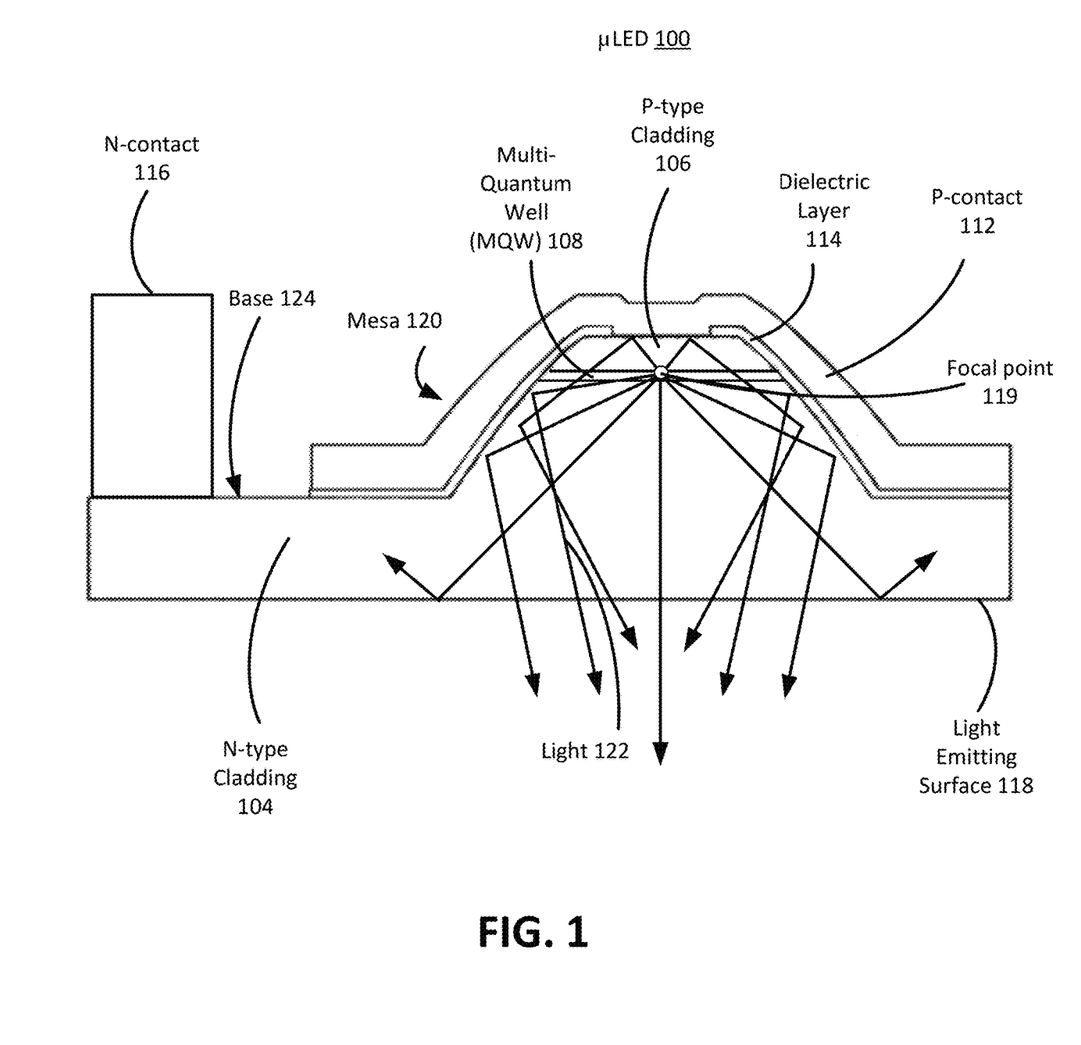
FIG. 1 is a schematic cross-section of a micro-LED, according to one embodiment.

FIG. 1 is a schematic diagram illustrating a cross-sectional view of a μLED 100, in accordance with one embodiment. The μLED 100 is an example of a semiconductor device that can be transferred from a carrier substrate to a target substrate using a pick and place operation. The μLED 100 can include, among other components, a semiconductor structure including an n-type cladding 104, a p-type cladding 106, and a multi-quantum well ("MQW") 108 between the n-type cladding 104 and the p-type cladding 106. The μLED 100 further includes a dielectric layer 114 on the semiconductor structure, a p-contact 112 on the dielectric layer 114, and an n-contact 116 on the n-type cladding 104. The semiconductor structure is shaped (e.g., via an etch process, via a growth process, etc.), into a mesa 120 and a base 124 of the mesa 120. The p-type cladding 106 defines the top of the mesa 120 (in the configuration shown in FIG. 1), and the n-type cladding 104 defines a portion of the mesa 120 and the base 124. In some embodiments, an n-type cladding defines the top portion of the mesa 120 and a p-type cladding defines the bottom portion of the mesa 120 and the base 124 (in the configuration shown in FIG. 1). As such, the configuration of the p-contact 112 and the n-contact 116 can be reversed in relation to the top and bottom portions of the mesa 120 and the base 124.

The multi-quantum well 108 defines an active light emitting area that is included in the structure of the mesa 120. The μLED 100 may include one or more quantum wells. The mesa 120 may include a truncated top defined on a side opposed to a light emitting surface 118 of the μLED 100. In some embodiments, the semiconductor structure including the n-type cladding 104, MQW 108, and p-type cladding 106 is an epitaxial structure grown on a growth substrate.

The mesa 120 may include various shapes, such as a parabolic shape with a truncated top, to form a reflective enclosure for light 122 generated within the μLED 100. In other embodiments, the mesa 120 may include a cylindrical shape with a truncated top, or a conic shape with a truncated top, or some other light-collimating shape. The arrows depicted in FIG. 1 indicate paths of light 122 emitted from the MQW 108 in relation to reflection off the p-contact 112 and internal walls of the mesa 120 toward the light emitting surface 118 at an angle sufficient for the light to escape the μLED 100 (i.e., within a critical angle of total internal reflection). The p-contact 112 and the n-contact 116 are examples of electrical contact pads, and electrically connect the μLED 100, such as to a display substrate including a control circuit for the μLED 100. The n-contact 116 is formed at the base 124, which is defined by a surface of the n-type cladding 106 opposite the light emitting surface 118. The n-contact 116 can include a conductive material that extends to the top of the mesa 120 to support the placement of the μLED 100 on the display substrate with the p-contact 112 and the n-contact 116 bonded to the display substrate.

The μLED 100 can include an active light emitting area defined by the MQW 108. The structural and material configuration of the μLED 100 directionalizes the light output from the MQW 108 and increases the brightness level of the light output. In particular, the p-contact 112 may be reflective for the light 122 emitted from the MQW 108. The mesa 120 and p-contact 112 cause reflection of the light 122 from the MWQ 108 to form a collimated or quasi-collimated light beam emerging from the light emitting surface 118.

In an embodiment, the mesa 120 can be formed by an etching process applied to the semiconductor structure of the μLED 100, which includes the n-type cladding 104, the MQW 108, and the p-type cladding 106, during wafer processing steps. The etching process results in the MQW 108 being positioned in the structure of the mesa 120 (e.g., within a concave portion of the mesa 120), and at a particular distance to the p-contact 112 to facilitate the collimation of the light 122. In some embodiments, the MQW 108 is positioned at a parabolic focal point 119 of the mesa 120 defined by the parabolic shape of the mesa 120. A portion of the generated light 122 is reflected at the mesa 120 to form the quasi-collimated light beam emitted from the light emitting surface 118.

Figure 2:
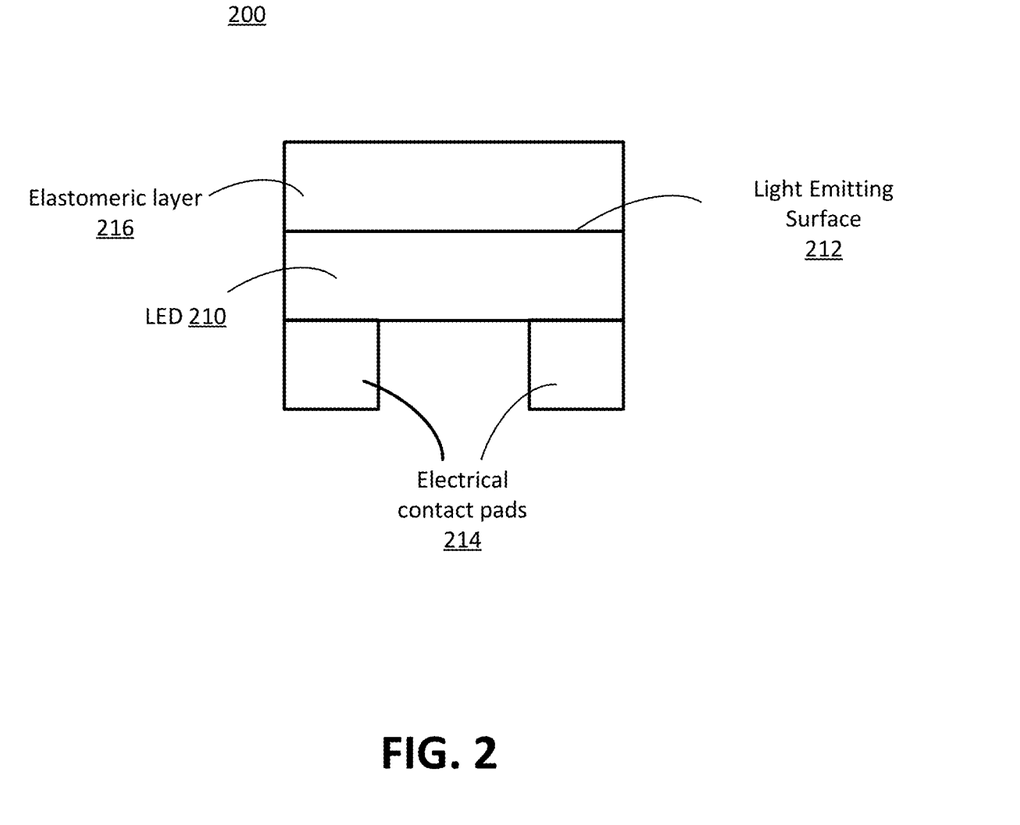
FIG. 2 is a cross-sectional view of an LED die, according to one embodiment.

FIG. 2 is a cross-sectional view of an LED die 200, according to one embodiment. The LED die 200 may include, among others, an LED 210, an elastomeric layer 216, and electrical contact pads 214. The LED 210 may be an embodiment of μLED 100 shown in FIG. 1), or may be some other type of LED. The electrical contact pads 214 serve as interconnects for the LED die 200 when the LED die 200 is mounted to a display substrate. The elastomeric layer 216 is disposed on (e.g., coupled to) the light emitting surface 212 of the LED 210. In embodiments where the LED die 200 is an embodiment of μLED 100 shown in FIG. 1, the electrical contact pads 214 can include embodiments of the n-contact 116 and the p-contact 112, and the light emitting surface 212 can be an embodiment of the light emitting surface 118 shown in FIG. 1. As discussed in greater detail below with respect to FIGS. 3, 5A-5C, and 6A-6C, the elastomeric layer 216 facilitates attachment of the LED die 210 with pick-up surfaces of a pick and place head (PPH).

The techniques discussed herein, such as the use of a PPH to pick and place, is not limited to small semiconductor devices (e.g., μLED dies), and can also be applied to larger semiconductor devices, such as larger semiconductor devices with more relaxed spacing parameters. In some embodiments, the pick and place operations discussed herein may be applicable to vertical-cavity surface-emitting lasers (VCSELs).

Fabrication System Overview

Figure 3A:
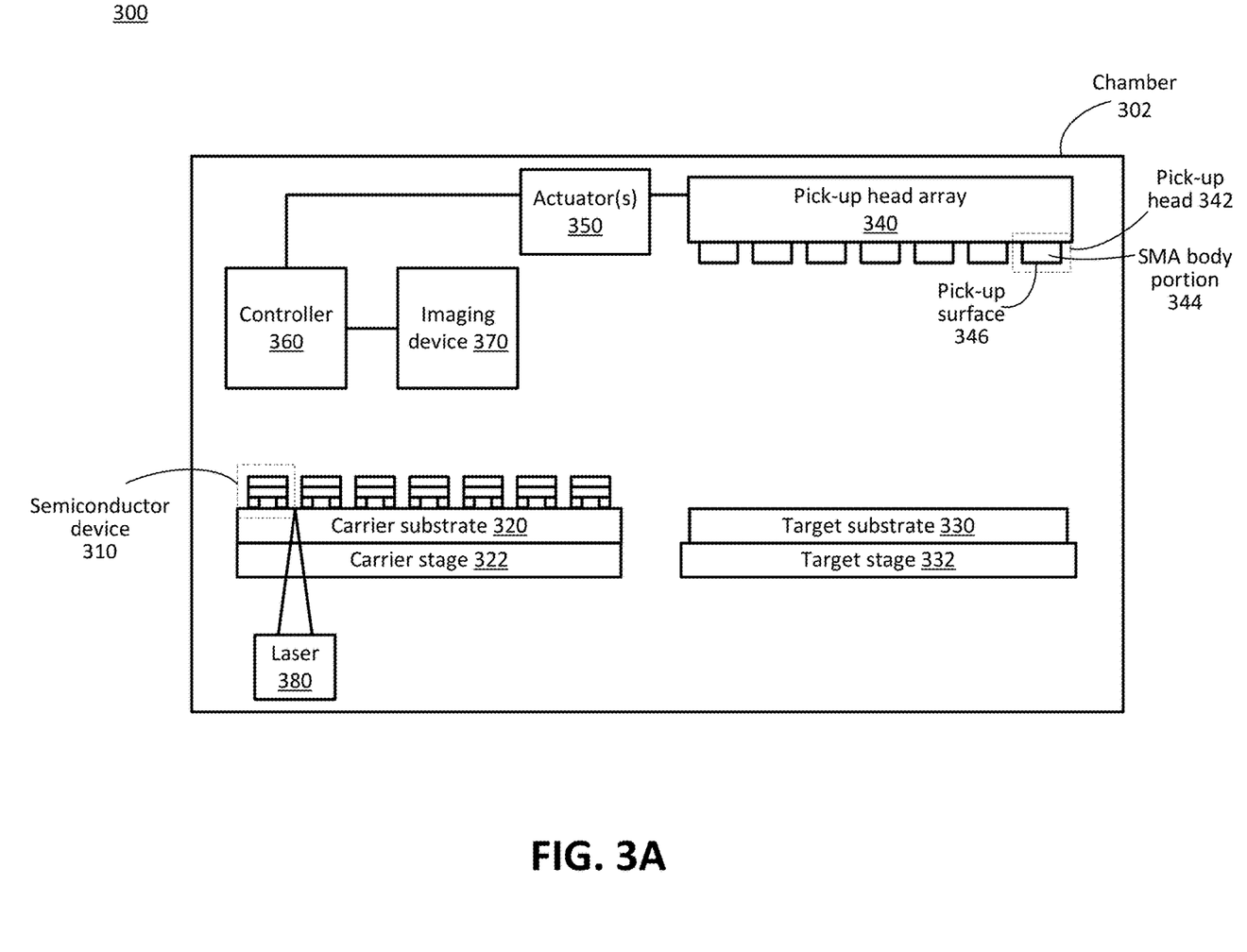
FIG. 3A is a block diagram illustrating a display fabrication system, according to one embodiment.

FIG. 3A is a block diagram illustrating a display fabrication system 300, according to an embodiment. The system 300 fabricates an electronic display by assembling semiconductor devices 310 from a carrier substrate 320 to a target substrate 330. In some embodiments, the semiconductor devices 310 are different color LED dies (e.g., an embodiment of LED die 200 shown in FIG. 2), or individual VCSELs. The carrier substrate 320 holds the semiconductor devices 310 for pick up and/or transport by the pick-up head array 340. The target substrate 330 may be a display substrate, or may be an intermediate carrier substrate that facilitates bonding with a display substrate. The system 300 places the semiconductor devices 310 at pixel locations of the target substrate 330, and then bonds the semiconductor devices 310 to the target substrate 330 and/or ultimately, to a display substrate (e.g., if the target substrate 330 is an intermediate carrier substrate). In some embodiments, the semiconductor devices 310 are μLEDs having a reduced divergence of light output and small light emitting area. In other embodiments, the semiconductor devices are VCSELs, or some other type of light emitting device. The system 300 provides selective pick and place of semiconductor devices of small size, but can be used to assemble other types of semiconductor devices.

The system 300 may include, among other components, a chamber 302 defining an interior environment for picking and placing semiconductor devices 310. The system 300 further includes the pick-up head array 340, an actuator 350, an imaging device 370, a carrier stage 322, a target stage 332, and a laser 380. The carrier stage 322 holds/positions a carrier substrate 320 having semiconductor devices 310. The target stage 332 holds/positions a target substrate 330 to receive some or all of the semiconductor devices 310 from the carrier substrate 320. A controller 360 is coupled to the imaging device 370 and the pick-up head array 340 (e.g., via the actuator 350) and controls the operations of the imaging device 370 and pick-up head array 340. For example, the controller 360 causes the pick-up head array 340 to pick up one or more semiconductor devices 310 located on a carrier substrate 320, and place the one or more semiconductor devices 310 on the target substrate 330. The controller 360 may use images captured by the imaging device 370 to perform alignment between the pick-up head array 340 and the carrier substrate 320 and/or the target substrate 330 for the pick and place operations.

Figure 3B:
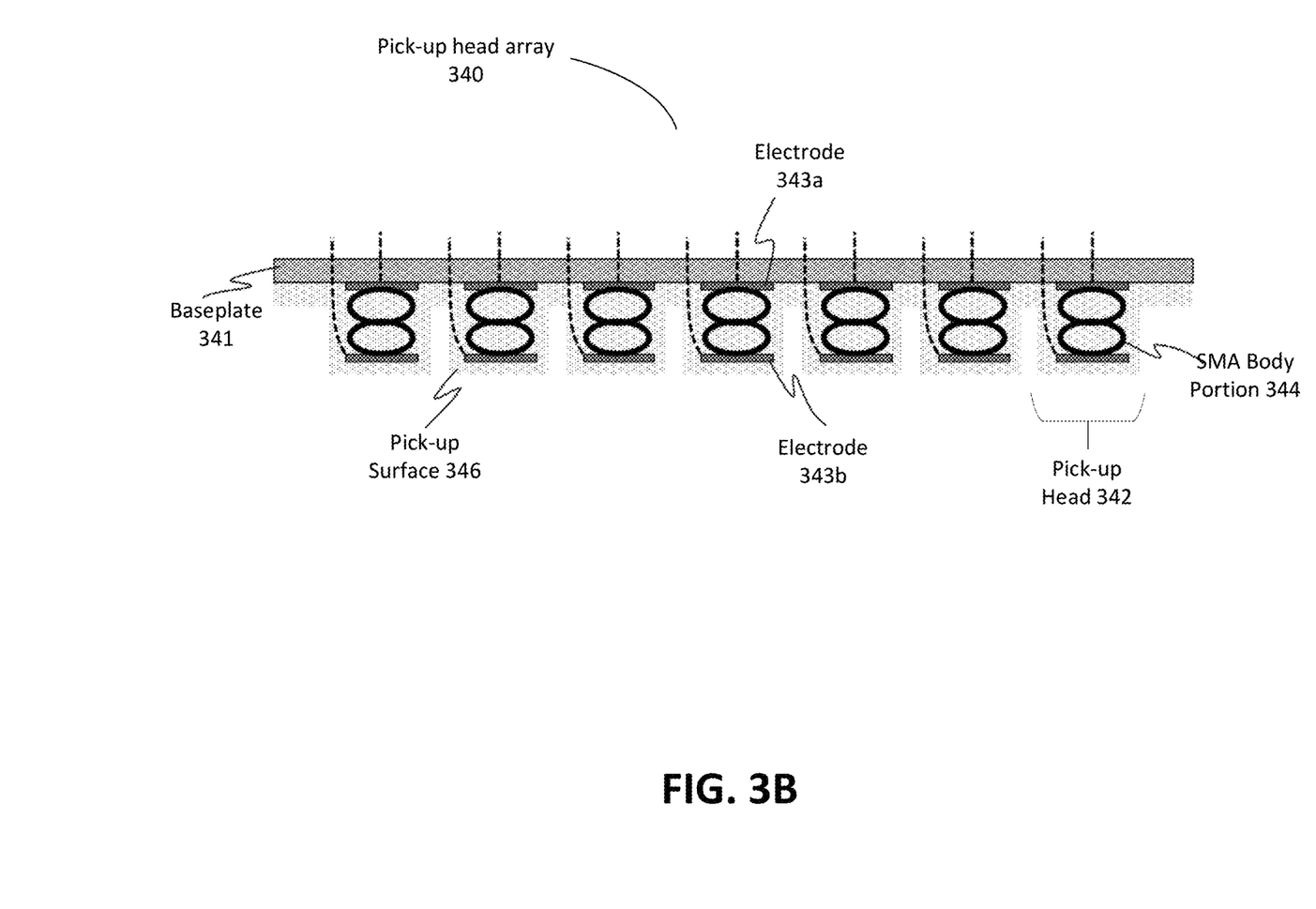
FIG. 3B is a schematic of an embodiment of the pick-up head shown in FIG. 3A.

The pick-up head array 340 includes multiple pick-up heads, including pick-up head 342, where FIG. 3B is a schematic of an embodiment of the pick-up head shown in FIG. 3A. Each pick-up head can pick up a semiconductor device, such as semiconductor device 310, from the carrier substrate 320, and place the semiconductor device on the target substrate 330. Each pick-up head 342 includes a shape memory alloy (SMA) body portion 344 made up of a SMA material and a pick-up surface 346 at a distal end of the SMA body portion 344. In more detail, the pick-up head array 340 shown in FIG. 3B includes a baseplate 341, to which a set of pick-up heads (including pick-up head 342) are coupled, where each pick-up head includes an SMA body portion 344 positioned between a set of electrodes (e.g., electrodes 343a and 343b), and where each pick-up head includes a material body providing a pick-up surface 346 at a distal end of the pick-up head.

In variations, the baseplate 341 can be composed of a rigid material that is composed of a conductive (i.e., thermally, electrically) or semi-conductive material, or that includes conductive or semi-conductive regions for allowing current delivery to the set of electrodes (e.g., electrodes 343a and 343b) for controlling the SMA body portion 344 in relation to transitions between extension and retraction. In an example, the baseplate 341 is composed of silicon; however, in other examples, the baseplate 341 can be composed of or otherwise include other materials (e.g., materials with suitable electrical conductivity, materials with suitable thermal conductivity, materials with suitable rigidity, etc.).

In variations, the SMA body portion 344 of each pick-up head can include multiple body portions, or have a morphology that provides desired characteristics during transitioning between extended and retracted states. The SMA body portion(s) 344 can thus include one or more of: prismatic portions, cylindrical portions, spheroidal portions, amorphous portions, and portions of any other suitable morphology. In the embodiment shown in FIG. 3B, the SMA body portion 344 of each pick-up head is sandwiched between a pair of electrodes (e.g., electrodes 343a and 343b); however, in alternative embodiments, the SMA body portion 344 of each pick-up head can be positioned relative to the electrode(s) in another manner, and the set of electrodes can include more or less than two electrodes. For instance, the electrodes can be positioned relative to the SMA body portion in a manner that controls heat distribution to the SMA body portion in a manner that controls extension and retraction of the SMA body portion in a desired manner (e.g., to produce asymmetric extension and retraction behaviors).

In the embodiment shown in FIG. 3B, each pick-up head includes a material body surrounding the electrodes (e.g., electrodes 343a and 343b) and providing a pick-up surface 346 at a distal end of the pick-up head. In alternative embodiments, however, the material body can be coupled only to a portion of the pick-up head configured to contact and/or reposition the semiconductor devices 310, and may not surround the entire pick-up head. In material composition, the material body of the pick-up surface 346 can be composed of an elastically deformable material (e.g., polymer) with suitable adhesion properties for repeatable picking up and/or repositioning semiconductor devices. In a specific example, the material body of the pick-up surface 346 can be composed of polydimethylsiloxane (PDMS); however, in other examples, the material body of the pick-up surface 346 can be composed of or surface treated with another suitable material (e.g., another polymer composition, another adhesive material).

The SMA body portion 344 of the pick-up head 342 extends when heat is applied and, in some embodiments, retracts when heat is removed. The pick-up surface 346 of the pick-up head 342 attaches to the semiconductor device 310, such as via an elastomeric layer or other type of conformable interface layer deposited on the pick-up surface 346 or the semiconductor device 310. After picking up a semiconductor device 310, the pick-up head 342 is aligned with a location on the target substrate 330. The pick-up head 342 releases the semiconductor device 310 at the location on the target substrate 330. The semiconductor device 310 may be released from the pick-up head 342 by the pick-up head 342 transitioning to the shortened state or by motion of the entire pick-up head array 340 while the semiconductor device 310 is more strongly adhered to the target substrate 330 than to the pick-up surface 346 of the pick-up head 342.

The SMA body portion 344 of each pick-up head 342 has at least a retracted state and an extended state. When heat is applied to the SMA body portion 344 of a pick-up head 342, the SMA body portion 344 transitions from its shortened state to its extended state, moving the pick-up head 342 downwards. In one embodiment, the SMA body portion 344 can also transition from its extended state to its shortened state responsive to the removal of heat (i.e., being cooled), moving the pick-up head 342 upwards. In some embodiments, the length of the SMA body portion 344 may be controlled by the amount of heat that is applied or removed. For example, application of a first amount of heat moves the pick-up head 342 extends the pick-up head 342 to a first length, and application of additional heat extends the pick-up head 342 to a second length that is longer than the first length. The shortened state may be a rest state of the SMA body portion 344 at environmental temperature.

The actuator 350 is an electro-mechanical component that controls the movement of the pick-up head array 340 based on instructions from the controller 360. For example, the actuator 350 may move the pick-up head array 340 with up to six degrees of freedom including up and down, left and right, forward and back, yaw, pitch, and roll. The actuator 350 may be embodied, for example, as a rotating motor, a linear motor or a hydraulic cylinder. In one embodiment, the actuator 350 only controls the pick-up head array 340 while the movement of individual pick-up heads 342 is controlled by the SMA body portions 344 of the pick-up heads 342. In another embodiment, the movements of each individual pick-up head 342 is controlled by the actuator 350 in addition to the SMA body portion 344 of the pick-up head 342.

The imaging device 370 facilitates a visual alignment for semiconductor device pick-up from the carrier substrate 320, and alignment for semiconductor device placement on the target substrate 330. For example, the imaging device 370 generates images of the pick-up head array 340 and the carrier substrate 320, and provides the images to the controller 360. In some embodiments, the imaging device 370 is an environmental scanning electron microscope (ESEM) to provide images without specimen coating, and the chamber 302 is an ESEM chamber including a high pressure atmosphere of water vapor. In various embodiments, other types of imaging devices 370 may be used to facilitate the alignments. Furthermore, in various embodiments, the system can include multiple imaging devices (e.g., a second imaging device configured for alignment of the pick-up head array 340 with the target substrate 330).

The controller 360 controls the operation of the pick-up head array 340. The controller 360 may selectively operate a subset of the pick-up heads 342 to attach a subset of the semiconductor devices 310 to the subset of pick-up heads 342 for a pick and place operation. The controller 360 may align pick-up heads 342 of the pick-up head array 340 with the carrier substrate 320 based on the images, and picks up one or more semiconductor devices 310 mounted on the carrier substrate 320. In another example, the imaging device 370 generates images of the one or more pick-up heads 342 of the pick-up head array 340 and the target substrate 330, and provides the images to the controller 360. The controller 360 may align the pick-up heads 342 with the target substrate 330 based on the images, and place the semiconductor devices 310 attached to the pick-up heads 342 on the display substrate 330.

In some embodiments, the carrier stage 322 and/or target stage 332 may be adjusted to facilitate precision alignment with the pick-up head array 340. For example, the carrier stage 322 and/or target stage 330 may include three degrees of freedom. The degrees of freedom may include left and right, backward and forward, and a yaw rotational degree of freedom. In embodiments, the carrier substrate 320 can be moved with the carrier stage 322, and the target substrate 330 can be moved with the target stage 332.

The system 300 may include one or more carrier substrates 320. For example, different carrier substrates 320 may carry different color LED dies. A carrier substrate 320 holds singulated semiconductor devices 310 for transfer to the target substrate 330. The system may include one or more target substrates 330. In some embodiments, such as when the target substrate 330 is the display substrate for receiving the semiconductor devices 310, the target stage 332 includes a heater for thermal conductive bonding of the electrical contact pads of the semiconductor devices 310 to the target substrate 330 subsequent to placement of the semiconductor devices 310 on the target substrate 330 by the pick-up head 340. In other embodiments, the target substrate 330 is an intermediate carrier substrate that is used to facilitate direct bonding of the semiconductor devices 310 with a separate display substrate.

In some embodiments, carrier substrate 320 may include a carrier tape or other adhesive layer to hold the semiconductor devices 310 in place with an adhesion force. A laser 380 may generate a laser beam to reduce the adhesion force during pick up of the semiconductor devices 310 by the pick-up head 340. In some embodiments, the adhesion reduction is applied to a subset of the semiconductor devices 310 on the carrier substrate 320 to facilitate pick-up of those devices while ensuring that other non-selected devices remain on the carrier substrate 320. In some embodiments, the laser beam is directed through the carrier substrate 320 to the adhesive layer. In alternative embodiments, the adhesion force provided by the adhesive layer is inherently lower than an adhesion force provided by the pick-up surface 346.

Method for Using a Pick-Up Head Array

Figure 4:
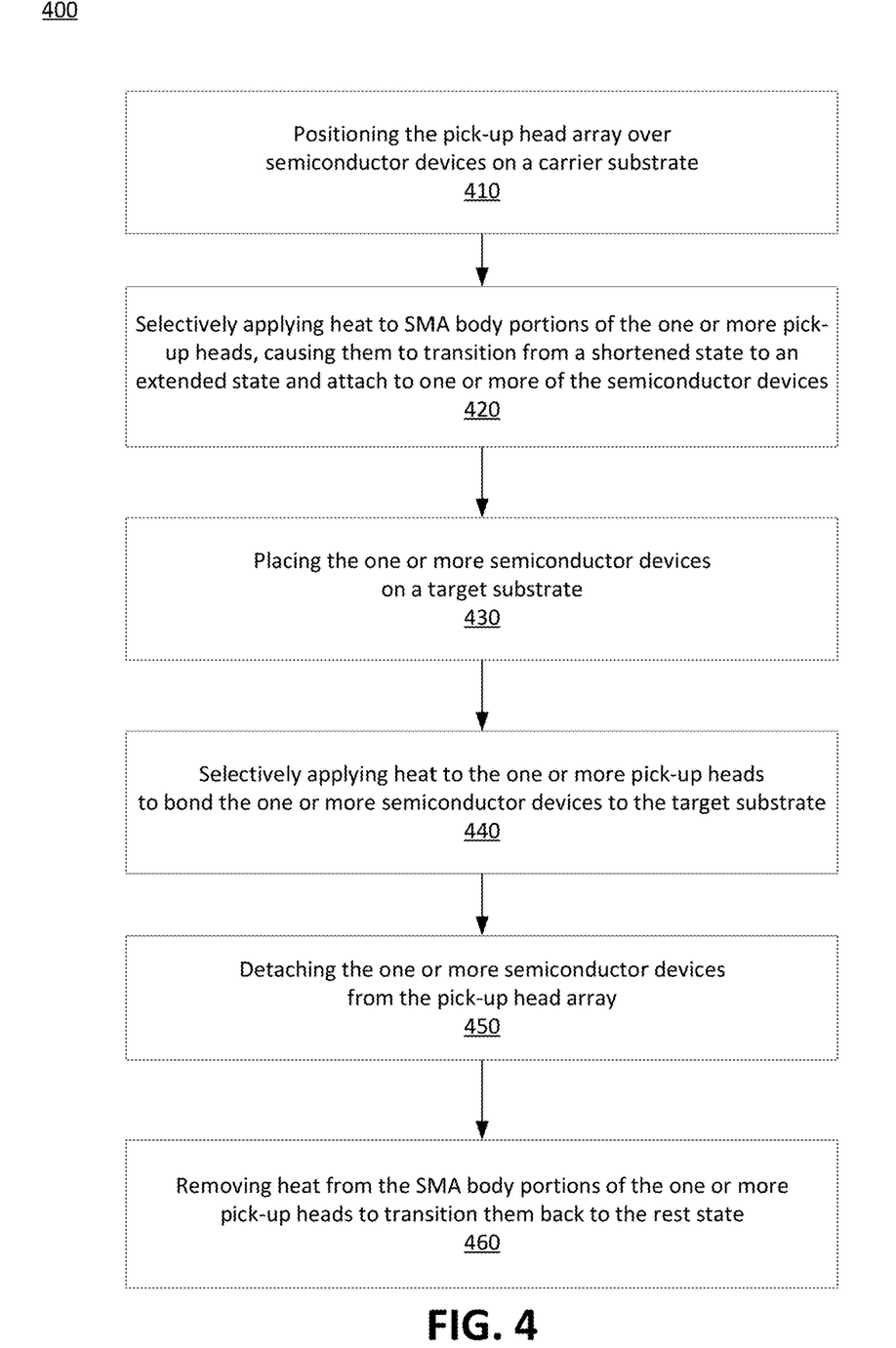
FIG. 4 is a flowchart of a method for using a pick-up head array, according to one embodiment.

FIG. 4 is a flowchart of a method 400 for using a pick-up head array, according to one embodiment. The pick-up head array selectively picks up and places semiconductor devices, such as μLEDs and VCSELs, during chip fabrication. The method 400 may include different and/or additional steps, or the steps may be in different orders.

In the selective pick-up process, the pick-up head array is positioned 410 over semiconductor devices located on a carrier substrate. Each pick-up head of the pick-up head array includes an SMA body portion that expands responsive to heat and a pick-up surface that can attach to a semiconductor device.

Heat is selectively applied 420 to the SMA body portions of one or more pick-up heads of the pick-up head array that are positioned over one or more of the semiconductor devices of interest located on the carrier substrate. In one embodiment, the heat is generated by applying a current through a resistive material in contact with the SMA body portions. The heat generated by the current passing through the resistive material flows from the resistive material to the SMA body portion. Responsive to the heat, the SMA body portions of the one or more pick-up heads transition from a shortened state (e.g., a rest state at environmental temperature) to an extended state, resulting in the one or more pick-up heads being longer (e.g., transitioned to an extended or expanded state) than other pick-up heads of the pick-up head array. The one or more pick-up heads in the extended state are able to contact and attach to the corresponding one or more semiconductor devices. In one embodiment, adhesive attachment occurs via elastomeric layers deposited on the pick-up head surfaces of the pick-up heads and/or the top (e.g., light emitting) surfaces of the semiconductor devices.

Subsequent to the one or more semiconductor devices being attached to the pick-up head array, the one or more semiconductor devices are removed from the carrier substrate and placed 430 on a target substrate, such as by movement of the entire pick-up head array, the individual pick-up heads, the carrier stage, and/or the target state. The target substrate may include contacts that line up with the one or more semiconductor devices being placed on the target substrate.

In some embodiments, heat is selectively applied 440 to the one or more pick-up heads to bond the attached semiconductor devices to the target substrate. This heat may be applied to the SMA body portions of the pick-up heads, or the pick-up surfaces of the pick-up heads, heating up the semiconductor devices attached to the pick-up heads. If the heat is applied 440 to the SMA body portions, the SMA body portions will transition from their shortened state to their extended state, or in some embodiments, from a first extended state to a second extended state. Extension of the SMA body portions moves the one or more pick-up heads downwards, exerting a downward force on the semiconductor devices that are in contact with the target substrate. The combination of heat and force can facilitate thermocompression bonding (TCB) between the contacts of the one or more semiconductor devices and the contacts of the target substrate. In some embodiments, the downward force of the TCB process may be generated by downward movement of the pick-up heads or the entire pick-up head array, while heat is applied from another source such as the target stage.

After the one or more semiconductor devices have been bonded to the target substrate, the one or more semiconductor devices are detached 450 from the pick-up head array. In one embodiment, detachment 450 occurs because the one or more semiconductor devices are bonded more strongly to the target substrate than to the pick-up heads. When the pick-up heads are moved away from the target substrate, the weaker (e.g., adhesive) bond between the semiconductor devices and the pick-up heads results in the semiconductor devices being separated from the pick-up head array.

In some embodiments, heat is removed 460 from the SMA body portions of the one or more pick-up heads to transition them from their extended state back to their shortened state, or to a partial shortened state between their extended state and their initial shortened state. All of the pick-up heads may be placed in the shortened state for another selective pick and place operation where a selected subset of the pick-up heads are transitioned to the extended state. The heat removal 460 may be performed with the detachment 450, such that the upwards movement of the pick-up heads in response to the removal 460 of heat results in the detachment 450 of the semiconductor devices from the pick-up heads. In another example, the heat removal may be performed subsequent to separation of the pick-up heads from the semiconductor devices.

Example Use of a Pick-Up Head Array

Figure 5A:
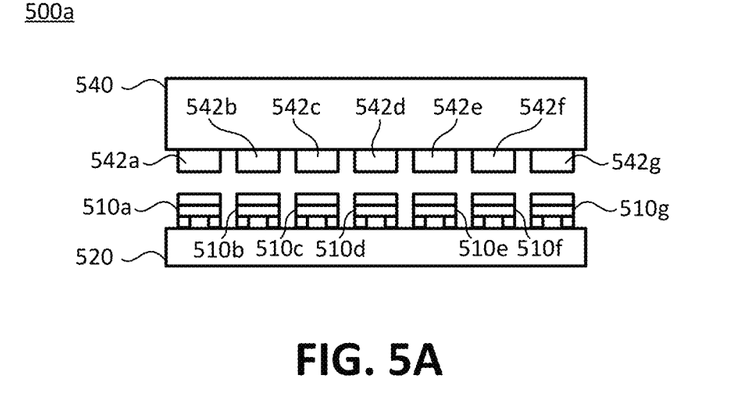
FIG. 5A shows a first state of an embodiment of a selective pick-up process, which occurs before semiconductor devices have been picked up by a pick-up head array.
Figure 5B:
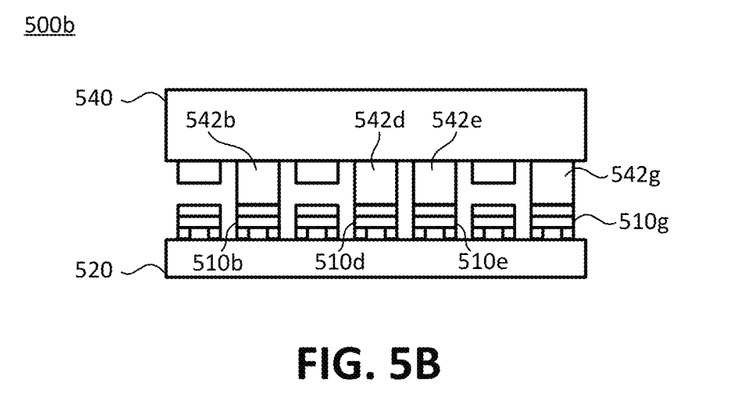
FIG. 5B shows a second state of the embodiment of the selective pick-up process shown in FIG. 5A, which occurs after a subset of the semiconductor devices have been attached to the pick-up head array but before they have been removed from the carrier substrate.
Figure 5C:
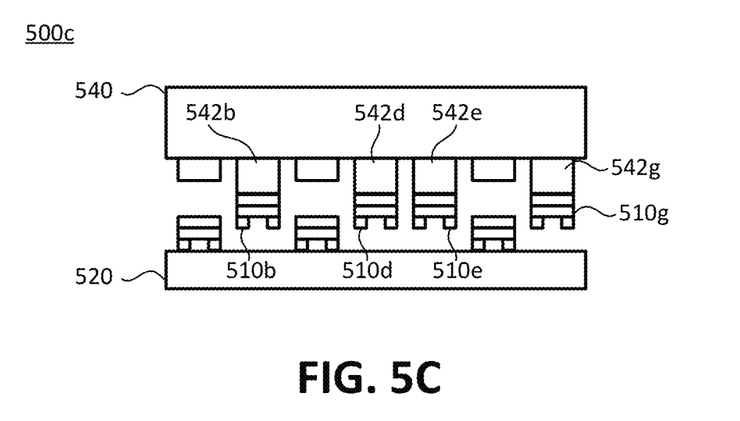
FIG. 5C shows a third state of the embodiment of the selective pick-up process shown in FIG. 5A, which occurs after the subset of the semiconductor devices have been removed from the carrier substrate by the pick-up head array.

FIGS. 5A-5C are diagrams illustrating semiconductor devices 510 being selectively picked up from a carrier substrate 520 by a pick-up head array 540, according to an embodiment. FIG. 5A shows a first state 500a of the selective pick-up process, which occurs before the semiconductor devices 510a-g have been picked up by the pick-up head array 540. FIG. 5B shows a second state 500b of the selective pick-up process, which occurs after a subset of the semiconductor devices 510a-g have been attached to the pick-up head array 540 but before they have been removed from the carrier substrate 520. FIG. 5C shows a third state 500c of the selective pick-up process, which occurs after the subset of the semiconductor devices 510a-g have been removed from the carrier substrate 520 by the pick-up head array 540.

In the first state 500a of the selective pick-up process, as shown in FIG. 5A, the pick-up head array 540 is positioned over a plurality of semiconductor devices 510a-510g on a carrier substrate 520. Each pick-up head 542a-g of the pick-up head array 540 is positioned directly over a corresponding semiconductor device 510a-g. That is, pick-up head 542a is directly above semiconductor device 510a, pick-up head 542b is directly above semiconductor device 510b, pick-up head 542c is directly above semiconductor device 510c, pick-up head 542d is directly above semiconductor device 510d, pick-up head 542e is directly above semiconductor device 510e, pick-up head 542f is directly above semiconductor device 510f, and pick-up head 542g is directly above semiconductor device 510g. Each of the pick-up heads 542a-g includes an SMA body portion that is capable of transitioning to the extended state when heat is applied. In this first state 500a, heat has not yet been applied and all of the pick-up heads 542a-g are in their shortened state.

In the second state 500b of the selective pick-up process, as shown in FIG. 5B, heat is applied to pick-up heads 542b, 542d, 542e, and 542g, causing them to extend towards the carrier substrate 520. In their extended state, pick-up heads 542b, 542d, 542e, and 542g contact semiconductor devices 510b, 510d, 510e, and 510g, respectively. This contact causes the semiconductor devices 510b, 510d, 510e, and 510g to attach to the pick-up surfaces of the extended pick-up heads 542b, 542d, 542e, and 542g, such as through an elastomeric layer. Pick-up heads 542a, 542c, and 542f are not heated and thus remain in their shortened state. Semiconductor devices 510a, 510c, and 510f do not come into contact with the pick-up heads 542a, 542c, and 542f and thus are not attached to the pick-up head array 540.

Figure 5D:
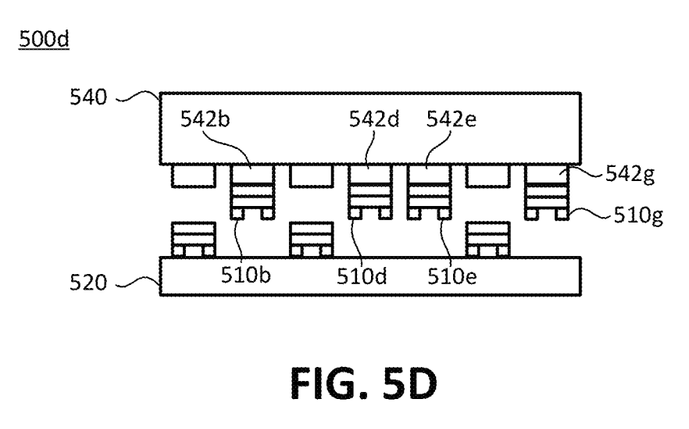
FIG. 5D shows an alternative embodiment of the third state shown in FIG. 5C

In the third state 500c of the selective pick-up process, as shown in FIG. 5C, the attached semiconductor devices 510b, 510d, 510e, and 510g are separated from the carrier substrate 520 by the pick-up head array 540. The pick-up heads 542b, 542d, 542e, and 542g may not return to their shortened state at this stage, and the attached semiconductor devices 510b, 510d, 510e, and 510g are separated from the carrier substrate 520 by the movement of the entire pick-up head array 540 (e.g., upwards). Alternatively, the heat may be removed from pick-up heads 542b, 542d, 542e, and 542g, causing them to return to their shortened state, or a secondary shortened state between their extended state and their initial shortened state, as shown in FIG. 5D, which is an alternative embodiment 500d of the third state shown in FIG. 5C. This retraction of the pick-up heads 542b, 542d, 542e, and 542g moves the attached semiconductor devices 510b, 510d, 510e, and 510g upwards and away from the carrier substrate 520.

Figure 6A:
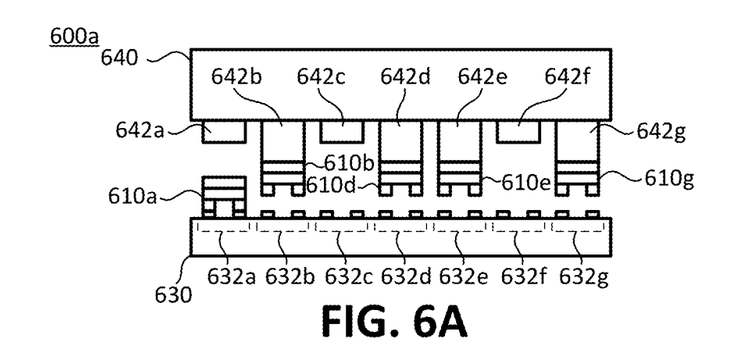
FIG. 6A shows a first state of an embodiment of a selective placement process, which occurs before semiconductor devices attached with a pick-up head array have been placed on the target substrate.
Figure 6B:
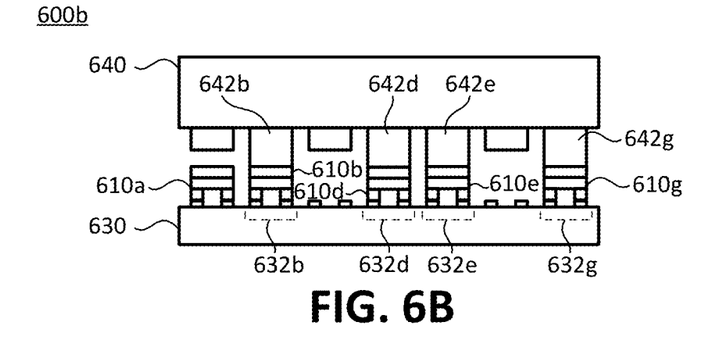
FIG. 6B shows a second state of the embodiment of the selective placement process shown in FIG. 6A, which occurs after the semiconductor devices have been placed on the target substrate and prior to separation from the pick-up head array.
Figure 6C:
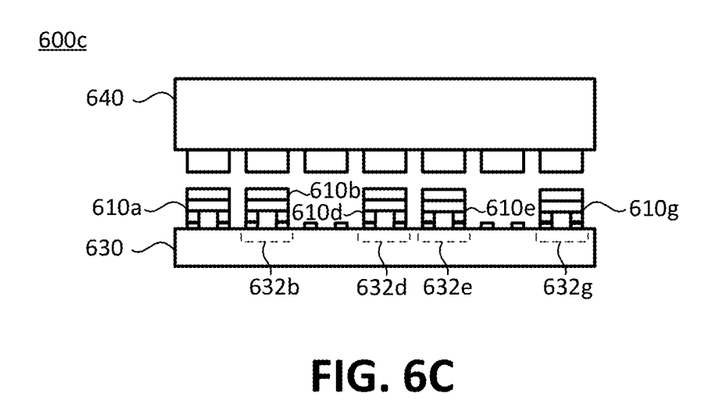
FIG. 6C shows a third state of the embodiment of the selective placement process shown in FIG. 6A, which occurs after the semiconductor devices have been separated from the pick-up head array.

FIGS. 6A-6C are diagrams illustrating semiconductor devices 610b, 610d, 610e, and 610g being selectively placed on a target substrate 630 by a pick-up head array 640, according to one embodiment. FIG. 6A shows a first state 600a of the selective placement process, which occurs before the semiconductor devices 610b, 610d, 610e, and 610g attached with the pick-up head array 640 have been placed on the target substrate 630. FIG. 6B shows a second state 600b of the selective placement process, which occurs after the semiconductor devices 610b, 610e, and 610g have been placed on the target substrate 630 and prior to separation from the pick-up head array 640. FIG. 6C shows a third state 600c of the selective placement process, which occurs after the semiconductor devices 610b, 610d, 610e, and 610g have been separated from the pick-up head array 640.

In the first state 600a of the selective placement process, as shown in FIG. 6A, the pick-up head array 640 is positioned over the target substrate 630. Contact pairs 632a-g are disposed on the target substrate 630 for coupling to semiconductor devices that are placed on the target substrate 630. Semiconductor device 610a is already coupled to the target substrate 630 via contact pairs 632a, such as from a previous selective placement process. The semiconductor devices 610b, 610d, 610e, and 610g are attached to pick-up heads 642b, 642d, 642e, and 642g, respectively. The contacts of the semiconductor devices 610b, 610d, 610e, and 610g are positioned directly above the corresponding contact pairs 632b, 632d, 632e, and 632g on the target substrate 630.

In the second state 600b of the selective placement process, as shown in FIG. 6B, with the pick-up heads 642b, 642d, 642e, and 642g in the extended state, the corresponding semiconductor devices 610b, 610d, 610e, and 610g come into contact with contact pairs 632b, 632d, 632e, and 632g, respectively. Pick-up heads 642a, 642c, and 642f are not heated and thus remain in their shortened state. Despite being located directly below pick-up head 642a, previously placed semiconductor device 610a does not come into contact with pick-up head 642a because it is in its shortened state.

In some embodiments, with the pick-up heads 642b, 642d, 642e, and 642g contacting the semiconductor devices 610b, 610d, 610e, and 610g and the semiconductor devices 610b, 610d, 610e, and 610g contacting the target substrate 630, additional heat is applied to the pick-up heads 642b, 642d, 642e, and 642g to bond semiconductor devices 610b, 610d, 610e, and 610g to the target substrate 630. For example, a current may be applied through the resistive material in contact with each of the SMA body portions of the pick-up heads 642b, 642d, 642e, and 642g to apply the additional heat. The additional heat applied to pick-up heads 642b, 642d, 642e, and 642g flows through the semiconductor devices 610b, 610d, 610e, and 610g to the contact pairs 632b, 632d, 632e, and 632g. This bonds the contacts of the semiconductor devices 610b, 610d, 610e, and 610g to the corresponding contact pairs 632b, 632e, 632d, and 632g on the target substrate 630. In some embodiments, the application of the additional heat that causes the bonding also causes the pick-up heads 642b, 642d, 642e, and 642g to apply a force to the semiconductor devices 610b, 610d, 610e, and 610g toward the target substrate 630 for TCB between the contacts of the semiconductor devices 610b, 610d, 610e, and 610g and the target substrate 630. This downward force may be generated by the SMA body portions of the pick-up heads 642b, 642d, 642e and 642g further expanding downward in response to the additional heat. That is, the pick-up heads 642b, 642d, 642e, and 642g expand from a first extended state to a second extended state that is longer than the first extended state. Alternatively or additionally, the downward force may be created by a downward movement controlled by the actuator(s) 350, either of the entire pick-up head array 640, or the individual pick-up heads 642b, 642d, 642e, and 642g.

In the third state 600c of the selective placement process, as shown in FIG. 6C, the semiconductor devices 610b, 610d, 610e, and 610g are detached from the pick-up head array 640 and remain on the target substrate 630. The entire pick-up head array 640 may move (e.g., upwards) to facilitate the detachment of the semiconductor devices 610b, 610d, 610e, and 610g from the pick-up heads 642b, 642d, 642e, and 642g. In some embodiments, heat may be removed from pick-up heads 642b, 642d, 642e, and 642g, causing them to retract upwards and return to their shortened state, or a secondary shortened state between their extended states and their initial shortened state. This retraction of the pick-up heads 642b, 642d, 642e, and 642g detaches the semiconductor devices 610b, 610d, 610e, and 610g from the pick-up heads 642b, 642d, 642e, and 642g because the adhesive force between the target substrate 630 and the semiconductor devices 610b, 610d, 610e, and 610g (via the contact pairs 632b, 632d, 632e, and 632g) is greater than the adhesive force between the semiconductor devices 610b, 610d, 610e, and 610g and the pick-up surfaces of the pick-up heads 642b, 642d, 642e, and 642g. In some embodiments, the pick-up heads 642b, 642d, 642e, and 642g are returned to the shortened state after separation from the semiconductor devices to perform another selective pick and place cycle.

Additional Considerations

Upon reading this disclosure, those of skill in the art will appreciate still additional alternative structural and functional designs for the described embodiments as disclosed from the principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A method comprising:
   positioning an array of pick-up heads over light emitting diodes (LEDs) on a carrier substrate, each of the pick-up heads of the array including:
   a shape memory alloy (SMA) body portion that transitions from a shortened state to an extended state responsive to application of heat; and
   a pick-up surface at an end of the SMA body portion; and
   selectively applying heat to one or more pick-up heads of the array, the application of heat causing the SMA body portion of each of the one or more pick-up heads to transition to the extended state to attach a respective LED of the LEDs on the carrier substrate with a pick-up surface of the pick-up head, wherein the pick-up surface of each of the one or more pick-up heads or the respective LED includes an elastomeric layer that provides adhesive attachment between the pick-up surface and the respective LED.

2. The method of claim 1, wherein selectively applying heat to the one or more pick-up heads comprises:
applying a current through the SMA body portion of each of the one or more pick-up heads.

3. The method of claim 1, further comprising:
with the one or more LEDs attached to the one or more pick-up heads, positioning the array of pick-up heads over a target substrate with contact pads of the one or more LEDs aligned with contact pads on the target substrate; and
selectively applying second heat to the SMA body portion of each of the one or more pick-up heads, the second heat flowing through the one or more LEDs to bond the contact pads of the one or more LEDs with contact pads of the target substrate.

4. The method of claim 3, wherein the second heat extends the one or more pick-up heads to compress the contact pads of the one or more LEDs against contact pads of the target substrate.

5. The method of claim 3, further comprising compressing, with the one or more pick-up heads, the contact pads of the one or more LEDs against the contact pads of the target substrate while the second heat is applied to the SMA body portion of each of the one or more pick-up heads.

6. The method of claim 1, further comprising:
removing heat from [[the SMA body portion of each of the one or more pick-up heads to cause the SMA body portions of the one or more pick-up heads to transition to the shortened state.

7. The method of claim 1, wherein the LEDs comprise one or more of micro-light-emitting diodes (µLEDs) and vertical-cavity surface-emitting lasers (VCSELs).

8. The electronic display of claim 1, wherein the process further comprises:
removing heat from the SMA body portion of each of the one or more pick-up heads, causing the SMA body portions of the one or more pick-up heads to transition to the shortened state.

9. A system, comprising:
an array of pick-up heads, each of the pick-up heads of the array including:
a shape memory alloy (SMA) body portion that transitions from a shortened state to an extended state responsive to application of heat; and
a pick-up surface at an end of the SMA body portion, the pick-up surface including an elastomeric layer that provides adhesive attachment.

10. The system of claim 9, wherein the SMA body portion further transitions from the extended state to the shortened state responsive to removal of heat.

11. The system of claim 9, wherein the heat is applied by applying a current through the SMA body portion.

12. The system of claim 9, further comprising:
a plurality of LEDs on a carrier substrate,
wherein selective application of heat causes one or more of the pick-up heads of the array to transition to the extended state and attach to one or more of the LEDs on the carrier substrate.

13. The system of claim 12, wherein the LEDs comprise one or more of micro-light-emitting diodes (µLEDs) and vertical-cavity surface-emitting lasers (VCSELs).

14. The system of claim 12, further comprising:
a target substrate configured to be positioned beneath the array of pick-up heads with contact pads of the one or more LEDs attached to the array of pick-up heads in contact with contact pads on the target substrate,
wherein selective application of second heat to the SMA body portion of each of the one or more pick-up heads of the array causes the second heat to flow through the one or more LEDs to bond the contact pads of the one or more LEDs with the contact pads of the target substrate.

15. The system of claim 14, wherein the second heat extends the one or more pick-up heads to compress the contact pads of the one or more LEDs against the contact pads of the target substrate.

16. An electronic display manufactured by a process, comprising:
positioning an array of pick-up heads over light emitting diodes (LEDs) on a carrier substrate, each of the pick-up heads of the array including:
a shape memory alloy (SMA) body portion that transitions from a shortened state to an extended state responsive to application of heat; and
a pick-up surface at an end of the SMA body portion;
selectively applying heat to one or more pick-up heads of the array, the application of heat causing the SMA body portion of each of the one or more pick-up heads to transition to the extended state to attach a respective LED of the LEDs on the carrier substrate with a pick-up surface of the pick-up head, wherein the pick-up surface of each of the one or more pick-up heads or the respective LED includes an elastomeric layer that provides adhesive attachment between the pick-up surface and the respective LED; and
with the one or more LEDs attached to the one or more pick-up heads, placing the one or more LEDs on a display substrate of the electronic display.

17. The electronic display of claim 16, wherein selectively applying heat to the one or more pick-up heads comprises:
applying a current through the SMA body portion of each of the one or more pick-up heads.

18. The electronic display of claim 16, wherein the process further comprises:
with the one or more LEDs attached to the one or more pick-up heads, positioning the array over a target substrate with contact pads of the one or more LEDs aligned with contact pads on the target substrate; and
selectively applying second heat to the SMA body portion of each of the one or more pick-up heads, the second heat flowing through the one or more LEDs to bond the contacts pads of the one or more LEDs with the contact pads of the target substrate.

* * * * *

UNITED STATES PATENT AND TRADEMARK OFFICE
CERTIFICATE OF CORRECTION

PATENT NO. : 10,707,105 B1  
APPLICATION NO. : 16/287096  
DATED : July 7, 2020  
INVENTOR(S) : Pooya Saketi Page 1 of 1

It is certified that error appears in the above-identified patent and that said Letters Patent is hereby corrected as shown below:

In the Claims

Column 13, Line 26, Claim 6, delete "removing heat from [[the SMA body portion" and insert
-- removing heat from the SMA body portion --.

Column 14, Line 56, Claim 18, delete "to bond the contacts pads of the one or more LEDs" and insert
-- to bond the contact pads of the one or more LEDs --.

Signed and Sealed this
Seventeenth Day of November, 2020

Andrei Iancu
*Director of the United States Patent and Trademark Office*